United States Patent [19]
Maeda et al.

[11] Patent Number: 5,717,312
[45] Date of Patent: Feb. 10, 1998

[54] CHARGING DEVICE PROVIDING A STABLE DISPLAY OF THE RESIDUAL CHARGE IN A BATTERY

[75] Inventors: Teruhiko Maeda; Hong Zuo, both of Ichikawa, Japan

[73] Assignee: Uniden Corporation, Tokyo, Japan

[21] Appl. No.: 668,154

[22] Filed: Jun. 21, 1996

[30] Foreign Application Priority Data

Feb. 23, 1996 [JP] Japan ................................ 8-036881

[51] Int. Cl.$^6$ .................................................. H01M 10/46
[52] U.S. Cl. .................... 320/30; 320/43; 320/48
[58] Field of Search ................................ 320/5, 9, 21, 29, 320/30, 39, 40, 43, 44, 48; 324/427, 433; 340/636; 429/90

[56] References Cited

U.S. PATENT DOCUMENTS

| | | | |
|---|---|---|---|
| 4,560,937 | 12/1985 | Finger | 320/39 X |
| 5,119,011 | 6/1992 | Lambert | 320/43 |
| 5,341,084 | 8/1994 | Gotoh et al. | 320/44 |
| 5,479,085 | 12/1995 | Honda et al. | 320/48 |
| 5,508,600 | 4/1996 | Myslinski et al. | 320/48 |

FOREIGN PATENT DOCUMENTS

| | | |
|---|---|---|
| 5-54916 | 3/1993 | Japan. |
| 5-83182 | 4/1993 | Japan. |
| 5-273316 | 10/1993 | Japan. |
| 7-72226 | 3/1995 | Japan. |

*Primary Examiner*—Edward Tso
*Attorney, Agent, or Firm*—Lowe, Price, LeBlanc & Becker

[57] ABSTRACT

A control section periodically measures a battery voltage with the battery voltage measuring section when the portable electronic apparatus is used in a normal operation mode, updating a measurement value stored in the storage section only when a measurement value at a current point of time is smaller than a previous measurement value stored in the storage section, and periodically measures a battery voltage with the battery voltage measuring section during charging, updating a measurement value stored in the storing section only when a measurement value at the current point of time is larger than a previous measurement value stored in the storage section, and displaying a residual charge in the battery according to the updated measurement value in the storage section.

13 Claims, 11 Drawing Sheets

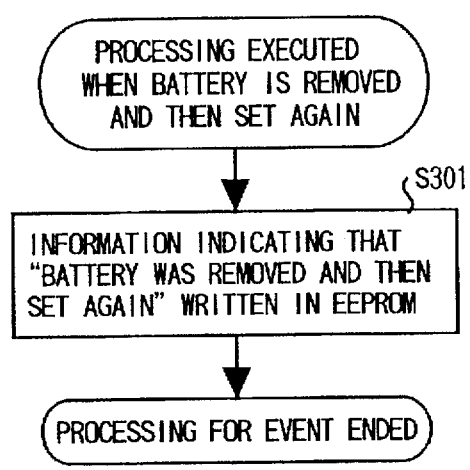
F I G. 3

▨ : RESIDUAL CHARGE "LARGE"

▧ : RESIDUAL CHARGE "MEDIUM"

◨ : RESIDUAL CHARGE "SMALL"

☐ : BATTERY LOW

CHARGING DEVICE PROVIDING A STABLE DISPLAY OF THE RESIDUAL CHARGE IN A BATTERY

FIELD OF THE INVENTION

The present invention relates to a charging device for a battery supplied portable electronic apparatus, and more particularly to a charging device which can provide a stable display of a residual charge in a battery by despite fluctuation of a battery voltage caused by a change in a consumed current with time, and also which can accurately detect a residual charge in a battery and display it according to an actually measured value of a battery voltage.

BACKGROUND OF THE INVENTION

A conventional type of charging device for battery-supplied portable electronic apparatus, may use the previously measured electric discharge characteristics of the battery, data concerning the electric discharge characteristics is compared to a currently measured battery voltage to determine a preset residual voltage display rank, and the rank is displayed.

In a first example of a charging device based on the conventional technology, there occur such problems as that accurate display can not be provided immediately after a no-load state has been changed such as in the case where power is just turned ON, or immediately after a charging voltage is applied even for a short period of time, because a terminal voltage in a battery becomes higher as compared to that during electric discharge, or that, as a terminal voltage in a battery largely changes due to fluctuation in a load, accurate display can not be provided in a wireless machine in which load changes due to switching in transmitting/receiving modes, switching a level of transmitting output or the like, and also there occur such problems as that a residual charge can not be displayed for a long time in a battery such as a nickel-cadmium battery with a small drop of a terminal voltage which will substantially drop when the battery is used for a long time.

A charging device which can solve the problems as described above is described for instance, in Japanese Patent Laid-Open Publication No.83182/1993. In the second example of a charging device based on the conventional technology, an initial value of a residual charge in the battery is set by detecting a state where the battery is fully charged, a product of a value indicating a consumed current for each operation mode of a telephone set previously stored in a consumed current value storage section and a time of use measured with a timer, is subtracted from the initial value of a residual charge value for the battery. The result to be displayed is always stored in a battery residual charge storage section for display.

As described above, in the charging device in the first example described above, when the battery is raised from a charging base immediately after charging is finished, sometimes a true residual charge in the battery can not be displayed because the displayed value of the battery voltage is slightly higher than an actual residual value in the battery and gradually drops as time goes by. Also, or that the battery voltages fluctuates according to a discharge current. Because of these features, it is difficult for a user to determine an accurate residual charge in the battery from a fluctuating display of a residual charge in the battery.

In the charging device in the second example described above, control over a display for a residual charge in the battery is provided by computing an estimated consumed current, so that there is a limit in accuracy of a display for a residual charge in a battery, and because of the features as described above, accurate display can not be provided.

SUMMARY OF THE INVENTION

It is an object of the present invention to provide a charging device which can reliably display a residual charge in a battery, taking into account a change in a measured value of a battery voltage with time, to prevent a display for a residual charge in a battery from becoming unstable due to a change in a consumed current with time.

It is another object of the present invention to provide a charging device which can more accurately detect a residual value in a battery and display it according to the actual measured value of a battery voltage, and at the same time separate a charging terminal, determining whether the battery has fully been charged or not, for measurement of a voltage in the battery.

With the charging device according to the present invention, a control section periodically measures a battery voltage with a battery voltage measuring section when a portable electronic apparatus is used in a normal operation mode, updates a measurement value stored in a storage section only when a measurement value at a current point of time is smaller than a previous measurement value stored in the storage section, and displays a residual charge in a battery according to the updated measurement value in the storage section, so that it is possible to provide a charging device which can stabilize the display of a residual charge in a battery even in case of intermittent receiving or intermittent burst transmission where a consumed current is large and the battery voltage largely changes with time.

With the charging device according to the present invention, the control section periodically measures a battery voltage during charging with the battery voltage measuring section, updates a measurement value in the storage section only when a measurement value at the current point of time is larger than a previous measurement value stored in the storage section, and displays a residual charge in the battery according to the updated measurement value in the storage section, so that, when the operating state shifts to the normal operating state in which a charging voltage is not supplied, there occurs no contradiction between displays for a residual charge in the battery during charging and in the normal operating mode, which makes it possible to provide a charging device which can more accurately detect and display a residual charge in a battery.

With the charging device according to the present invention, the control section periodically measures a battery voltage with the battery voltage measuring section when the portable electronic apparatus is used in the normal operation mode, updates a measurement value stored in the storage section only when a measurement value at the current point of time is smaller than a previous measurement value stored in the storage section, and also periodically measures a battery voltage during charging with the battery voltage measuring section, updates a measurement value in the storage section only when a measurement value at the current point of time is larger than a previous measurement value stored in the storage section, decides a rank according to the updated measurement value in the storage section, and identifies/displays a residual charge in the battery according to the rank, and, furthermore, a threshold value for defining of a rank in the normal operation mode is different from that during charging, so that, in contrast to batteries in which a voltage during electric discharge is different from that during charging, the battery can flexibly respond to either electric discharge or charging and resultantly it is possible to provide a charging device which can display an accurate residual charge in the battery.

With the charging device according to the present invention, the control section detects a battery voltage with the battery voltage measuring section to determine whether the battery has fully been charged or not, thus a state being detected during charging where charging from the charging control section is not required, and the charging terminal is separated to be measured, so that it is possible to provide a charging device which can detect and display a more accurate residual charge in a battery.

With the charging device according to the present invention, information indicating that a battery was once removed and then set again is stored in the storage section when the battery was once removed and again set, and the control section measures a battery voltage with the battery voltage measuring section, updates a measurement value in the storage section, and displays a residual charge in the battery according to the updated measurement value in the storage section, or decides a rank according to the updated measurement value in the storage section and identifies or displays a residual charge in the battery according to the rank immediately after power is turned ON or charging to the battery is stopped in a case where the information indicating that a battery was once removed and then set again is stored in the storage section, in a case where a measurement value stored in the storage section is not more than a prespecified value, or in a case where a rank decided according to a measurement value stored in the storage section is not more than a prespecified rank, so that it is possible to provide a charging device which can flexibly respond even to a case where a battery with a small quantity of residual charge is exchanged with a battery with a large quantity of residual charge.

Other objects and features of this invention will become understood from the following description with reference to the accompanying drawings.

BRIEF DESCRIPTION OF THE DRAWINGS

FIG. 3 is a flow chart for explaining processing carried out when a battery is removed and then set again;

FIG. 4 is a flow chart for explaining processing immediately after power is turned ON;

DESCRIPTION OF THE PREFERRED EMBODIMENTS

Next, a detailed description is made for outline of a charging device according to the present invention as well as for embodiments of the present invention with reference to related drawings.

Figure 1:
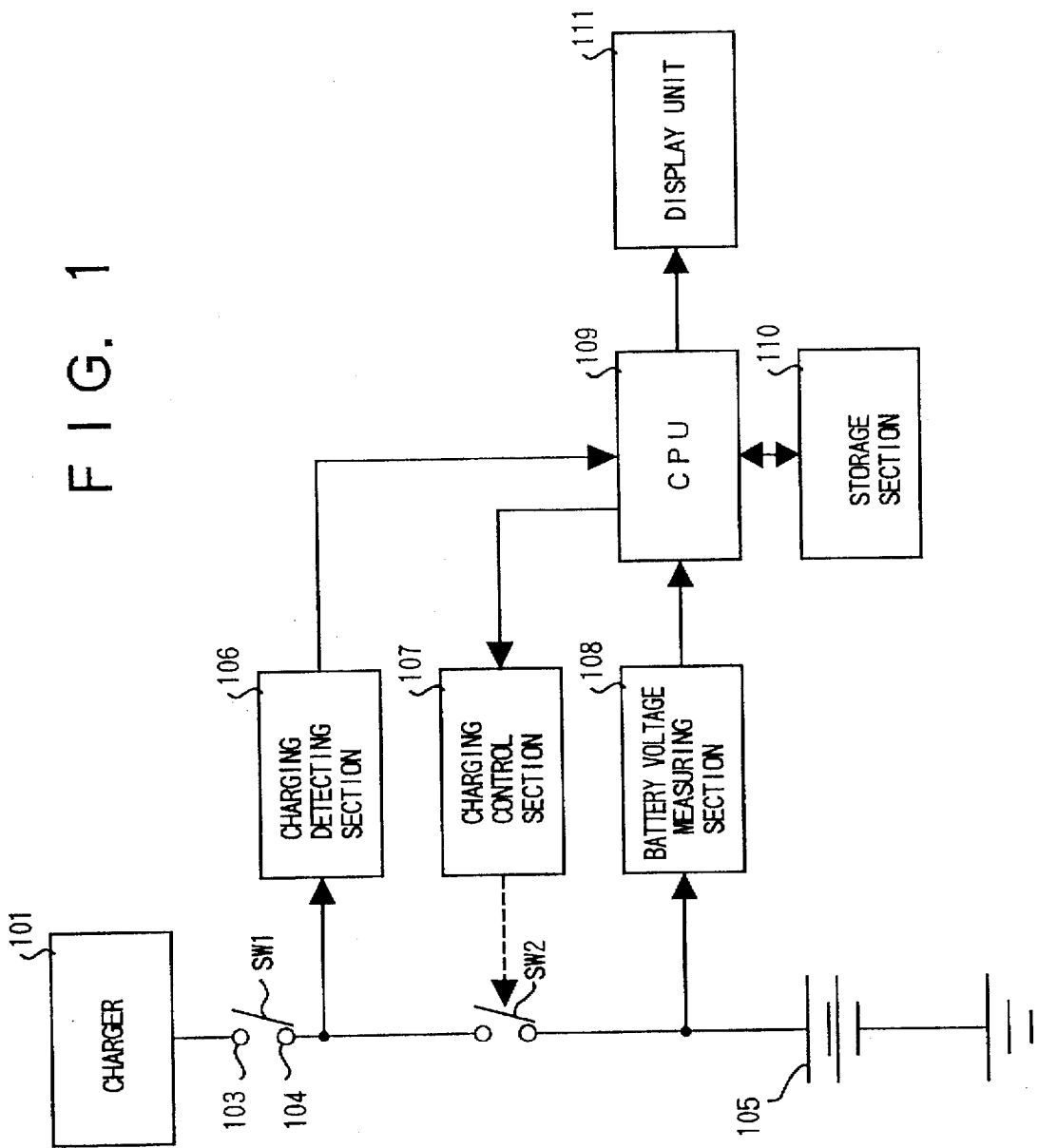
FIG. 1 is a block diagram showing a charging device according to an embodiment of the present invention.

In the charging device according to the present invention, as shown in FIG. 1, a control section 109 periodically measures a battery voltage with a battery voltage measuring section 108 when a portable electronic apparatus is used in the normal operation mode, updates a measurement value stored in a storage section 110 when a measurement value at a current point of time is smaller than a previous measurement value stored in the storage section 110, and displays a residual charge in a battery 105 according to the updated measurement value in the storage section 110. With this feature, a display for a residual charge in a battery can be stabilized even in case of intermittent receiving or intermittent burst transmission where a consumed current is large and the battery voltage substantially changes with time.

In the charging device according to the present invention, as shown in FIG. 1, the control section 109 periodically measures a battery voltage during charging with the battery voltage measuring section 108, updates a measurement value in the storage section 110 only when a measurement value at a current point of time is larger than a previous measurement value stored in the storage section 110, and displays a residual charge in the battery 105 according to the updated measurement value in the storage section 110. With this feature, when the operating state shifts to the normal operating state in which a charging voltage is not supplied, there is no contradiction between displays for a residual charge in the battery during charging and in the normal operation mode, which makes it possible to implement a charging device which can more accurately detect and display a residual charge in a battery.

In the charging device according to the present invention, as shown in FIG. 1, the control section 109 periodically measures a battery voltage with the battery voltage measuring section 108 when a portable electronic apparatus is used in the normal operation mode, updates a measurement value in the storage section 110 when a measurement value at a current point of time is smaller than a previous measurement value stored in the storage section 110, and also periodically measures a battery voltage during charging with the battery voltage measuring section 108, updates a measurement value in the storage section 110 only when a measurement value at a current point of time is larger than a previous measurement value stored in the storage section 110, determines a rank according to the updated measurement value in the storage section 110, and identifies/displays a residual charge in the battery 105 according to the rank, and furthermore as a threshold value that defines a rank in the normal operation mode is different from that during charging, so that, in contrast to batteries in which a voltage during electric discharge is different from that during charging, the battery can flexibly respond to either electric discharging or charging and resultantly can display an accurate residual charge in the battery.

In the charging device according to the present invention, the control section 109 detects a battery voltage with the battery voltage measuring section 108 to determine whether the battery has fully been charged or not, thus a state being detected where charging from the charging control section 107 is not required. As described above, it is possible to realize a charging device which can detect and display a more accurate residual charge in a battery by separating the charging terminal during a measurement.

In the charging device according to the present invention, information indicating that a battery was once removed and then set again is stored in the storage section 105 after the battery 110 was once removed and again set, and the control section 109 measures a battery voltage with the battery voltage measuring section 108, updates a measurement value in the storage section 110, and displays a residual charge in the battery 105 according to the updated measurement value in the storage section 110, or determines a rank according to the updated measurement value in the storage section 110 and identifies/displays a residual charge in the battery 105 according to the rank immediately after power is turned ON or the charging of the battery 105 is stopped in a case where the information indicating that a battery was once removed and then set again is stored in the storage section 110, in a case where a measurement value stored in the storage section 110 is not more than a prespecified value, or in a case where a rank decided according to a measurement value stored in the storage section 110 is not more than a prespecified rank. With this feature, no problem occurs even if a battery with a small quantity of residual charge is exchanged with a battery with a large quantity of residual charge.

FIG. 1 is a block diagram showing a charging device according to an embodiment of the present invention. In the figure, the charging device according to the embodiment comprises a charger 101 and a unit to be charged, and a battery 105 in the unit to be charged is charged by coupling a terminal 103 connected to the charger 101 to a terminal 104 connected to the unit to be charged, by turning ON a switch SW1.

The unit to be charged comprises a battery 105, a charging detecting section 106, a charging control section 107, a switch SW2, a battery voltage measuring section 108, a CPU 109, a storage section 110, and a display unit 111.

The charging detecting section 106 detects that the unit to be charged is placed on the charger 101 by detecting a potential level (level "H") in the terminal 104 and supplies an interrupt signal to the CPU 109. The battery voltage measuring section 108 measures a voltage in the battery 105, subjects the voltage to A/D conversion, and supplies the converted voltage to the CPU 109. The storage section 110 is realized with an EEPROM or the like, and data such as measurement voltage values in the battery 105 measured with the battery voltage measuring section 108 is stored in the storage section 110.

The processing related to charging carried out by the CPU 109 can be divided into two types of processing for charging control and processing for updating the display of a battery mark. In the processing for charging control, the CPU starts up in response to the interrupt signal from the charging detecting section 106, and provides an ON/OFF control to the switch SW2 with the charging control section 107 according to the measurement voltage value in the battery 105 measured with the battery voltage measuring section 108. Also in the processing for updating a display of a battery mark, the CPU determines an indication mode of the battery mark for indicating a residual charge in the battery on the display unit according to the measurement voltage value to store the mode in the storage section 110, and updates the battery mark on the display unit 111.

Next, a description is made for operations of the charging device according to the embodiment where a PHS terminal as a unit to be charged which is a portable electronic apparatus is described as an example in the following order (1) the mechanism of measuring a battery, (2) measuring the battery in connection with specific events, (3) periodically measuring the battery. It should be noted that a lithium-ion battery is used for the battery 105.

(1) Mechanism of Measuring a Battery Voltage

The data processing in connection with measuring a battery voltage includes the processing of charging control information and the data processing in connection with updating the display of the battery mark which were described above as the processing executed by the CPU 109. Description is made, with reference to FIG. 2, to show the states of the charging device according to the embodiment is present when the two processing procedures are carried out.

Figure 2:
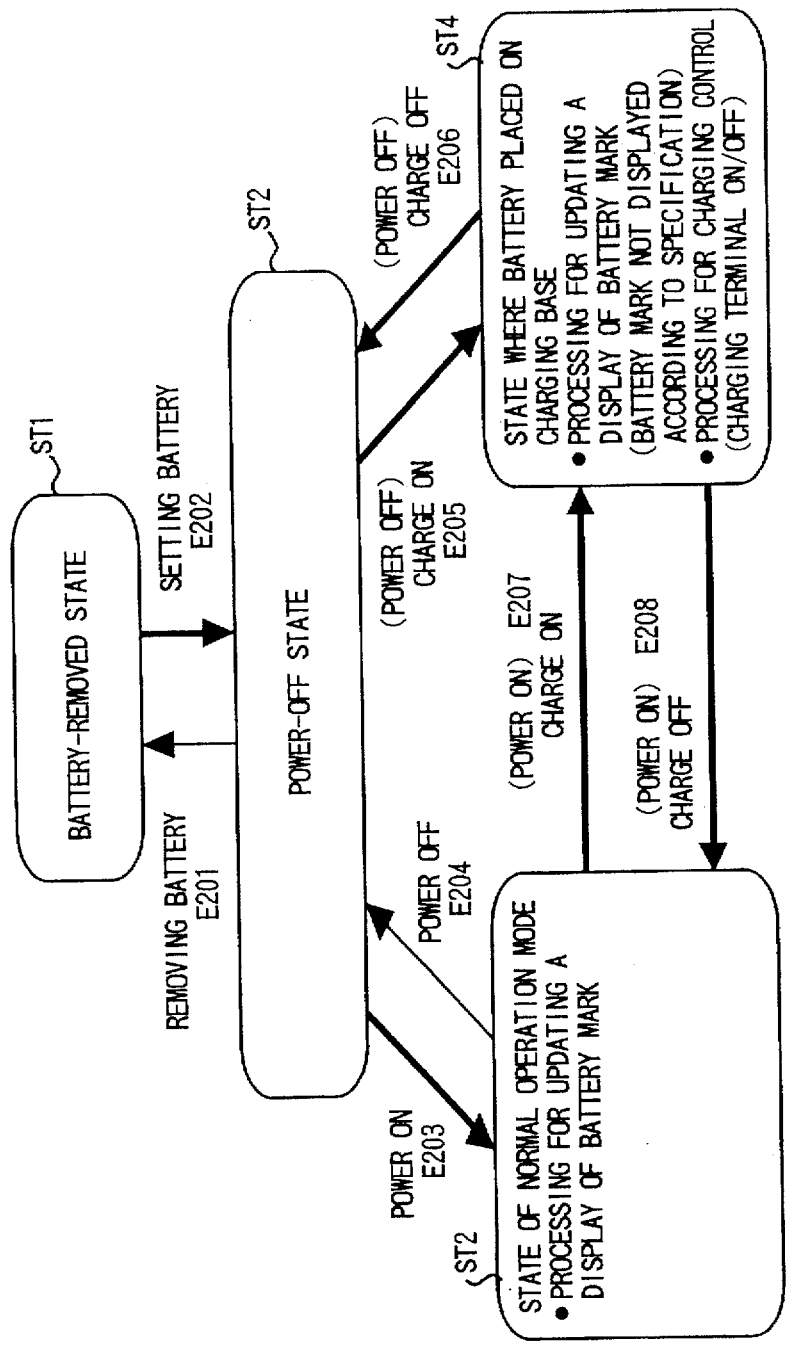
FIG. 2 is a transition diagram of some states which a PHS terminal can employ in connection with the measurement of a battery.

FIG. 2 is a view showing transitional states which the PHS terminal can take during the operations for measuring a battery voltage. In the figure, ST1 to ST4 indicate four states which the PHS terminal can take; namely a state ST1 where the battery is removed, a state ST2 where power is OFF, a state ST3 where the PHS terminal is used in the normal operation mode, and a state ST4 where the battery is placed on the charging base in the charger 101.

In the figure, E201 to E208 indicate events, and a state is changed from the power-OFF state ST2 to the battery-removed state ST1 in the event E201 of removing a battery, and the battery-removed state ST1 is changed to the power-OFF state ST2 in the event E202 of setting a battery. Then, a state is changed from the power-OFF state ST2 to the state ST3 where the PHS terminal is used in the normal operation mode in the event E203 of turning the power ON, and each from the state ST3 where the PHS terminal is used in the normal operation mode to the power-OFF state ST2 in the event E204 of turning the power OFF, the power-OFF state ST2 to the state ST4 where the battery is placed on the charging base in the event E205 of charging turned (power OFF), the state ST4 where the battery is placed on the charging base to the power-OFF state ST2 in the event E206 of charging turned OFF (power OFF), the state ST3 where the PHS terminal is used in the normal operation mode to the state ST4 where the battery is placed on the charging base in the event E207 of charging turned ON (power ON), from the state ST4 where the battery is placed on the charging base to the state ST3 where the PHS terminal is used in the normal operation mode in the event E208 of charging turned OFF (power ON) respectively. It should be noted that some arrows each with a heavy line among the arrows indicating the events (events E202, E203, E205 to E208) indicate that measurement concerning a change in a battery voltage described later is performed in each of the events descried above corresponding thereto.

(2) Measurement of a Battery Voltage in Connection with Specific Events

Measurement of a battery voltage performed in connection with specific events includes following data processing operations: (i) data processing carried out when a battery is removed and then set again, (ii) data processing executed immediately after power is tuned ON, (iii) data processing executed when charging is turned ON (immediately after a battery is placed on the charging base), and (iv) data processing carried out when charging is turned OFF (immediately after the battery is raised up from the charging base). Description is made for the processing in the order described above.

(i) Data Processing Executed when a Battery is Removed and then Set Again (Refer to FIG. 3)

The data processing executed when a battery is removed and then set again relates to data processing when the battery 105 is once removed (event E201) and then set again (the event E202). In this processing, as shown in FIG. 3, information indicating "that a battery was removed and then set again" is written in the storage section (EEPROM) 110 (Step S301). In this case, the battery 105 may have a small quantity of a residual charge therein, so that it may be necessary to replace it with a battery having a larger quantity of residual charge, and for this reason the processing described above is carried out to deal with the case above.

Figure 4:
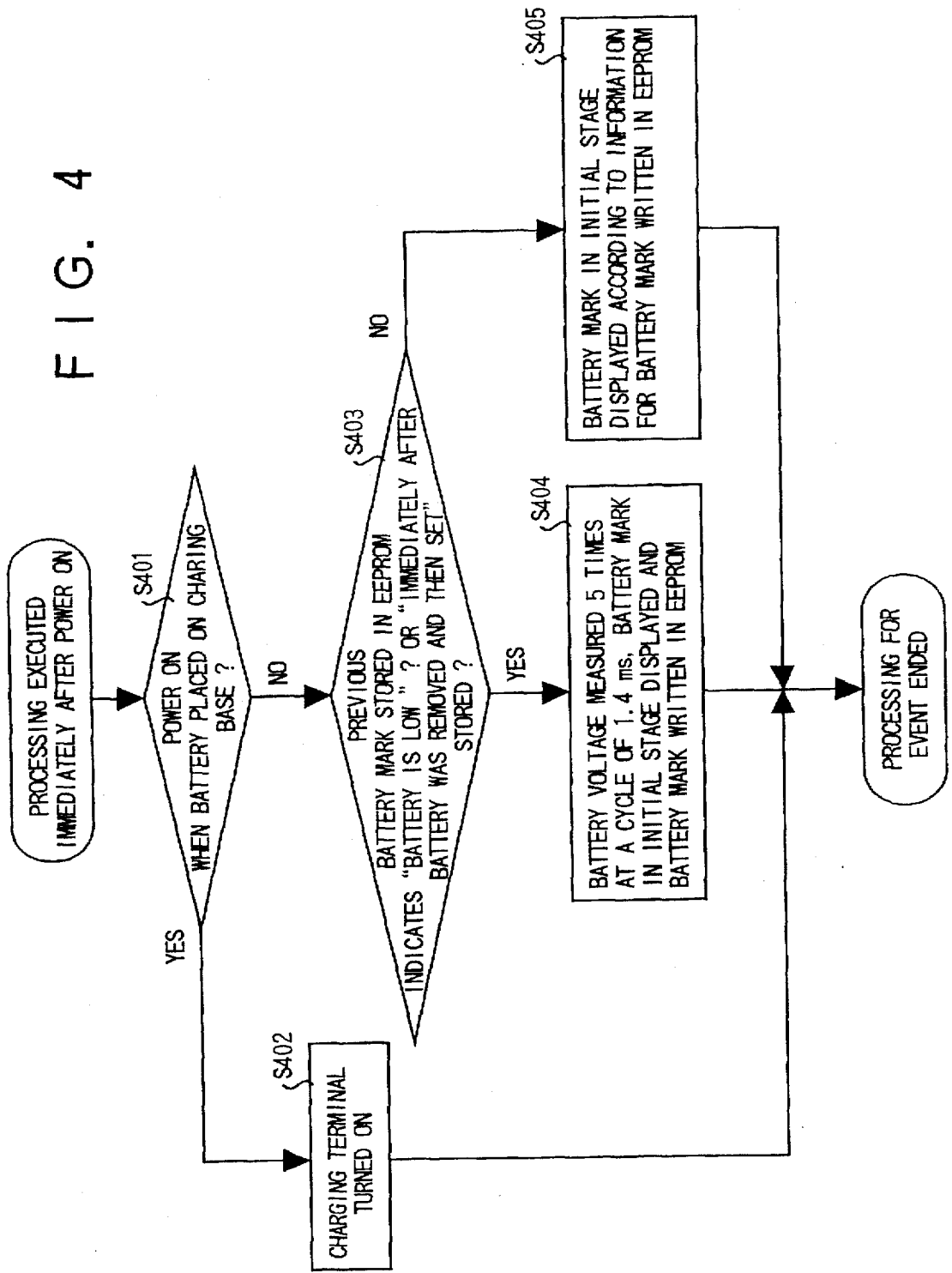

(ii) Processing Executed Immediately After Power Is ON (Refer to FIG. 4)

In the flow chart shown in FIG. 4, at first in Step S401, determination is made as to whether the event for power-ON has occurred in the state ST4 where a battery is placed on the charging base or not. If the event occurs when the battery is on the charging base, the event is determined as the event E208, and system control goes to Step S402, and then the switch SW2 is turned ON therein with the charging control section 107 to turn ON a charging terminal 104 (for setting the terminal to a level "H").

If the event when power is switched ON when the battery is not on the charging base, the event is determined as the event E203, and generally a display of a battery mark in an initial stage_is provided (Step S405). Namely, a display is provided according to the previous information for the battery mark written in the storage section 110.

As some exceptions, however, when the previous battery mark stored in the storage section 110 indicates "the battery is low", or when information indicating "after the battery was removed and then set" is stored in the storage section 110 (which the case is equivalent to "YES" according to the determination obtained in Step S403), taking into account exchange of the battery or recovery of a battery voltage, a battery voltage is measured 5 times at a cycle of 1.4 ms, a battery mark is determined according to the second largest value of the measured voltage values, the battery mark is displayed on the display unit 111, and then the information for the battery mark is written to the storage section 110 (Step S404).

Figure 5:
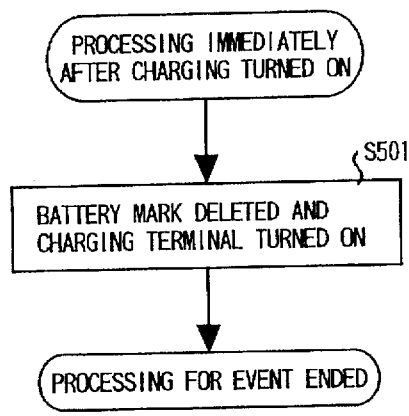
FIG. 5 is a flow chart for explaining processing carried out when a battery charging procedure is ON (immediately after the battery is placed on a charging base)

(iii) Processing Executed when Charging is Turned ON (Immediately after a Battery is Placed on the Charging Base) (Refer to FIG. 5)

When charging is turned ON (immediately after a battery is placed on the charging base), namely when the events E205 and E207 have occurred, as shown in the flow chart in FIG. 5, the only the operation for deleting the battery mark and turning ON the charging terminal 104 (setting to a level "H") are executed in Step S501, namely a voltage in the battery 105 is not measured in the step. The processing are executed regardless of power being ON or OFF.

Figure 6:
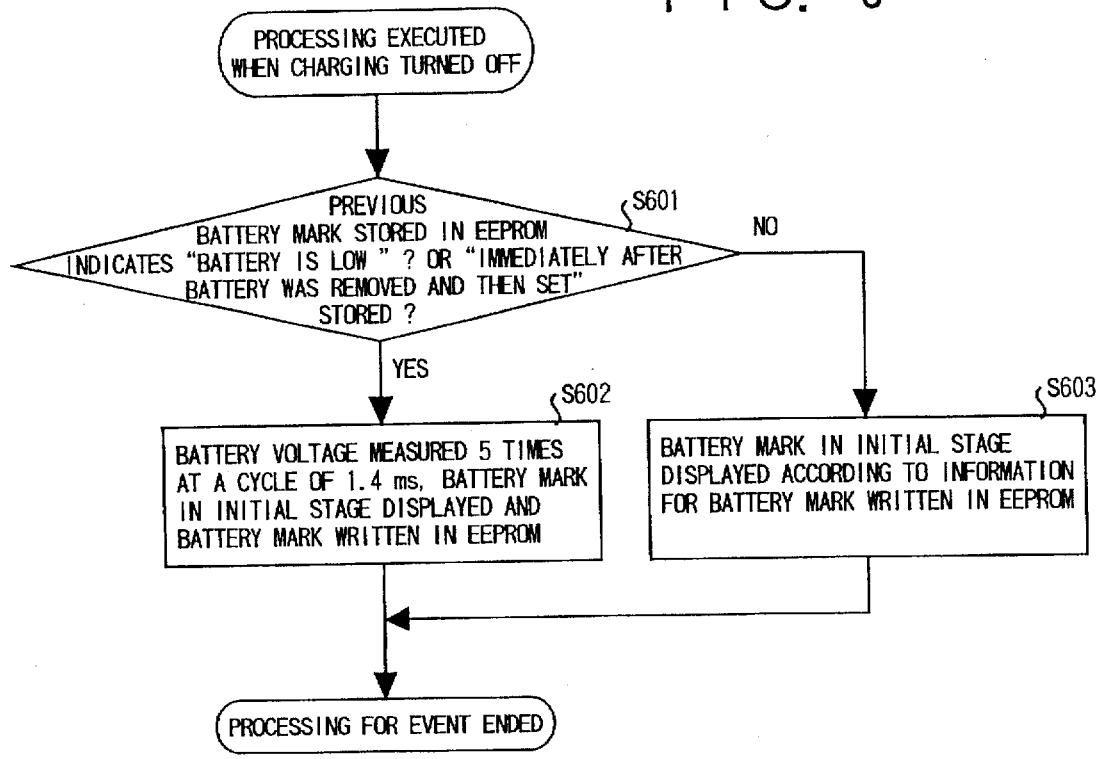
FIG. 6 is a flow chart for explaining processing carried out when a battery charging procedure is OFF (immediately after the battery is raised up from the charging base)

(iv) Processing Executed when Charging is Turned OFF (Immediately after the Battery is Raised up from the Charging Base) (Refer to FIG. 6)

When charging is turned OFF (immediately after the battery is raised up from the charging base), namely when the events E206 and E208 have occurred, as shown in the flow chart in FIG. 6, the battery mark in the initial stage is displayed as a rule (Step S603). Namely, the display according to the previous information for the battery mark written in the storage section 110 is performed.

As some exceptions, however, when the previous battery mark stored in the storage section 110 indicates "the battery is low", or when information indicating "after the battery was removed and then set" is stored in the storage section 110 (which the case is equivalent to "YES" according to the determination obtained in Step S601), taking into account an exchange of batteries or a recovery of a battery voltage, a battery voltage is measured 5 times at a cycle of 1.4 ms, a battery mark is determined according to the second largest value in the measured voltage values, the battery mark is displayed on the display unit 111, and then the information for the battery mark is written in the storage section 110 (Step S602). (3) Periodical Measurement of a Battery Voltage Next, a description is made for periodical measurement of a battery voltage. The periodical measurement of a battery voltage is performed in the normal operation mode, and executed when the microcomputer is shifted from a low power consumption mode to the normal operation mode (when an operation mode is started) in such a case as intermittent receiving (within the receiving zone) or searching (outside the receiving zone) to suppress an excessive consumed current for the PHS terminal.

For this reason, a cycle for measurement varies according to the operation modes provided in the PHS terminal; namely as to whether the PHS terminal is within the receiving zone or not. Namely, when it is within the receiving zone (when waiting for a call or a call connection is established), the battery voltage is measured intermittently, and the cycle for measurement is around one second. Also when the PHS terminal is outside of the receiving zone, the battery voltage is measured when a control channel is searched, and a cycle for measurement varies according to three modes provided in the PHS terminal. The cycle in a public/domestic mode is 10 seconds and around 3 seconds in a transceiver mode.

Figure 7:
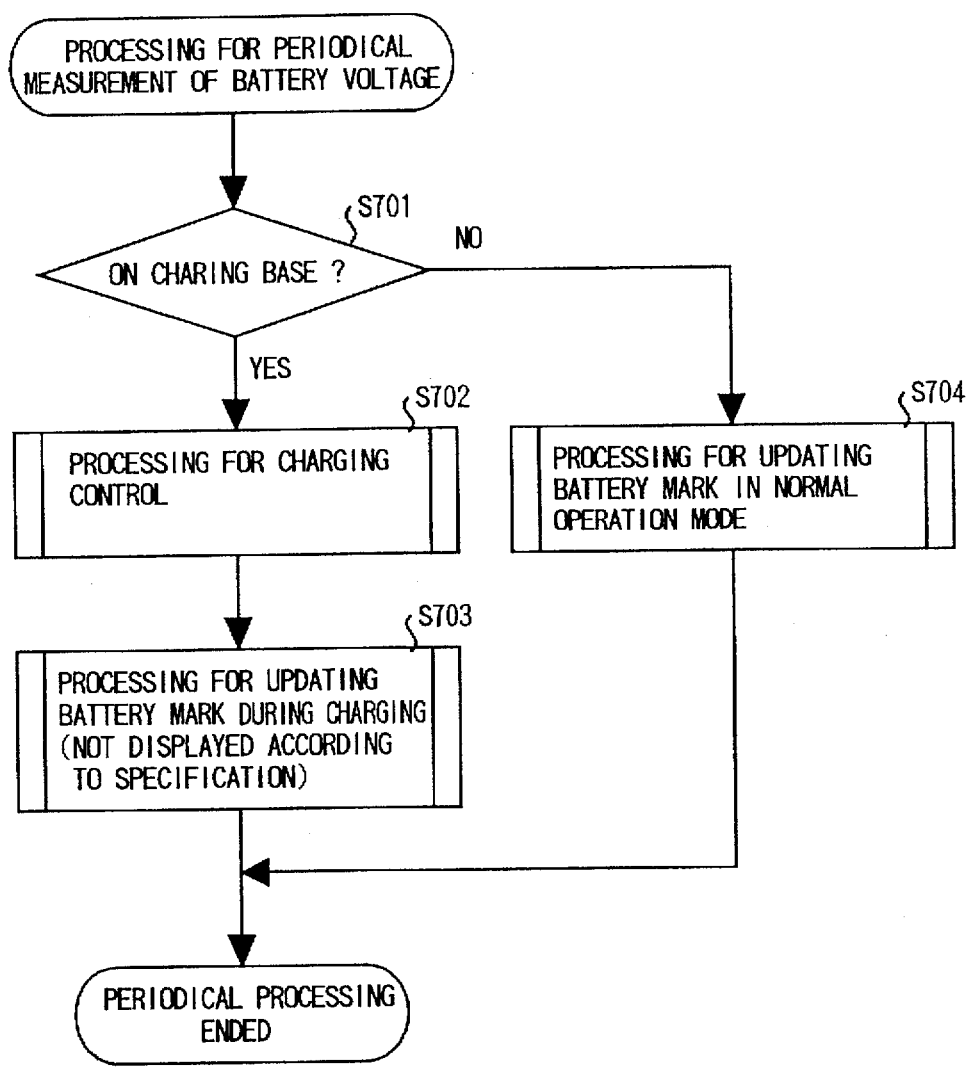
FIG. 7 is a schematic flow chart showing periodical measurement of a battery voltage.

FIG. 7 shows a schematic flow chart of a periodical measurement of a battery voltage. At first, determination is made in Step S701 as to whether a state is the state ST4 where a battery is placed on the charging base or the state ST3 where the PHS terminal is used in the normal operation mode. In a case of the state ST 4 where a battery is placed on the charging base, charging is controlled in Step S702, and then the battery mark during charging is updated in Step S703. Also in a case of the state ST 3 where the PHS terminal is used in the normal operation mode, the battery mark in the normal operation mode is updated in Step S704. Description is made hereinafter for outline of the processing for updating a display for the battery mark, and then detailed description is made for each of the processing in the order of (i) data processing in connection with updating a battery mark in the normal operation mode (Step S704), (ii) data processing in connection with updating a battery mark during charging (Step S703), (iii) data processing of charging control information (Step S702).

At first, description is made for the processing in connection with updating the display of a battery mark. The processing of updating the display of a battery mark is always carried out in periodical measurement of a battery voltage regardless of whether a battery is placed on the charging base or not. It should be noted that, in Step S703 where the PHS terminal is placed on the charging base, according to the specification, the display of the battery mark is not updated, a battery mark is determined according to the result of measurement of a battery voltage, and the information for the battery mark in the storage section 110 is updated.

Figure 8:
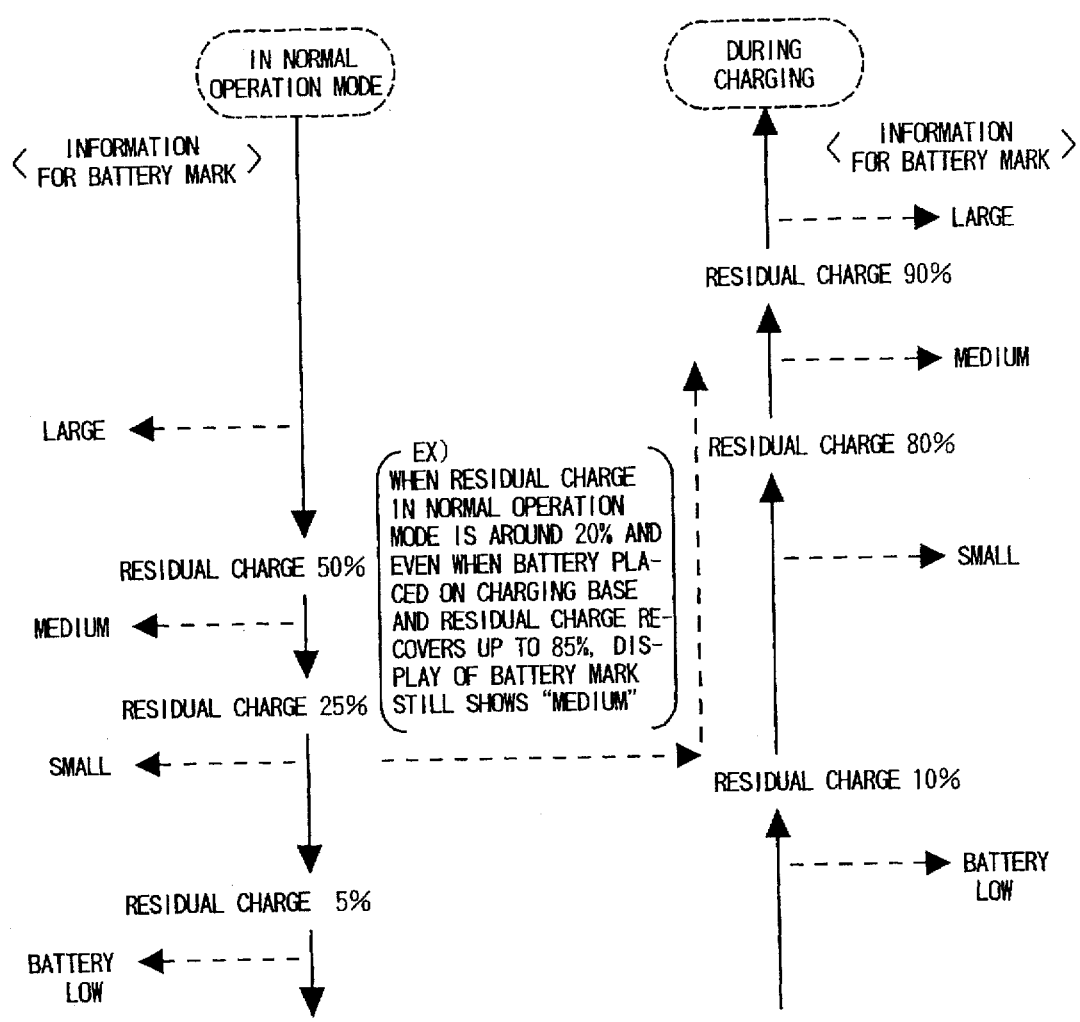
FIG. 8 is an explanatory view showing a change of a battery mark in the storage section during processing of display information relating to the battery mark in the embodiment.

FIG. 8 is an explanatory view showing changes of information for a battery mark in the storage section 110 according to an update thereof in the process of updating the display for the battery mark according to the embodiment. As shown in the figure, a change of the battery mark in the normal operation mode is indicated only in the direction where a residual charge in the battery falls, in contrast to the change thereof during charging when a residual charge in the battery rises. Also threshold values of information for the battery mark indicating "a large quantity", "a medium quantity", "a small quantity", and "the battery is low" are discretely provided each in the normal operation mode and during charging time respectively.

For instance, when a residual charge in the battery in the normal operation mode is around 20%, and even when the battery is placed on the charging base and the residual charge in the battery recovers up to 85% according to charging, the display of the battery mark does not change, but still indicates "a medium quantity". As described above, in contrast to batteries in which a battery voltage characteristic during electric discharge is different from that during charging, the battery can flexibly respond to either electric discharge or charging, and resultantly it is possible to display an index for an accurate residual charge in the battery with an appropriate battery mark.

Figures 9A, 9B:
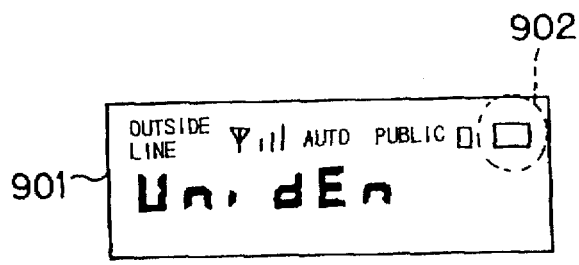
FIGS. 9A and 9B are explanatory views for explaining the display of the data for a battery mark on a display unit.

It should be noted that the information indicating "a large quantity", "a medium quantity", "a small quantity", and "the battery is low" on the display unit 111 is identified and displayed with any one of the battery marks, as shown in FIG. 9B, provided at the position indicated by the reference numeral 902 shown in FIG. 9A.

Figure 10:
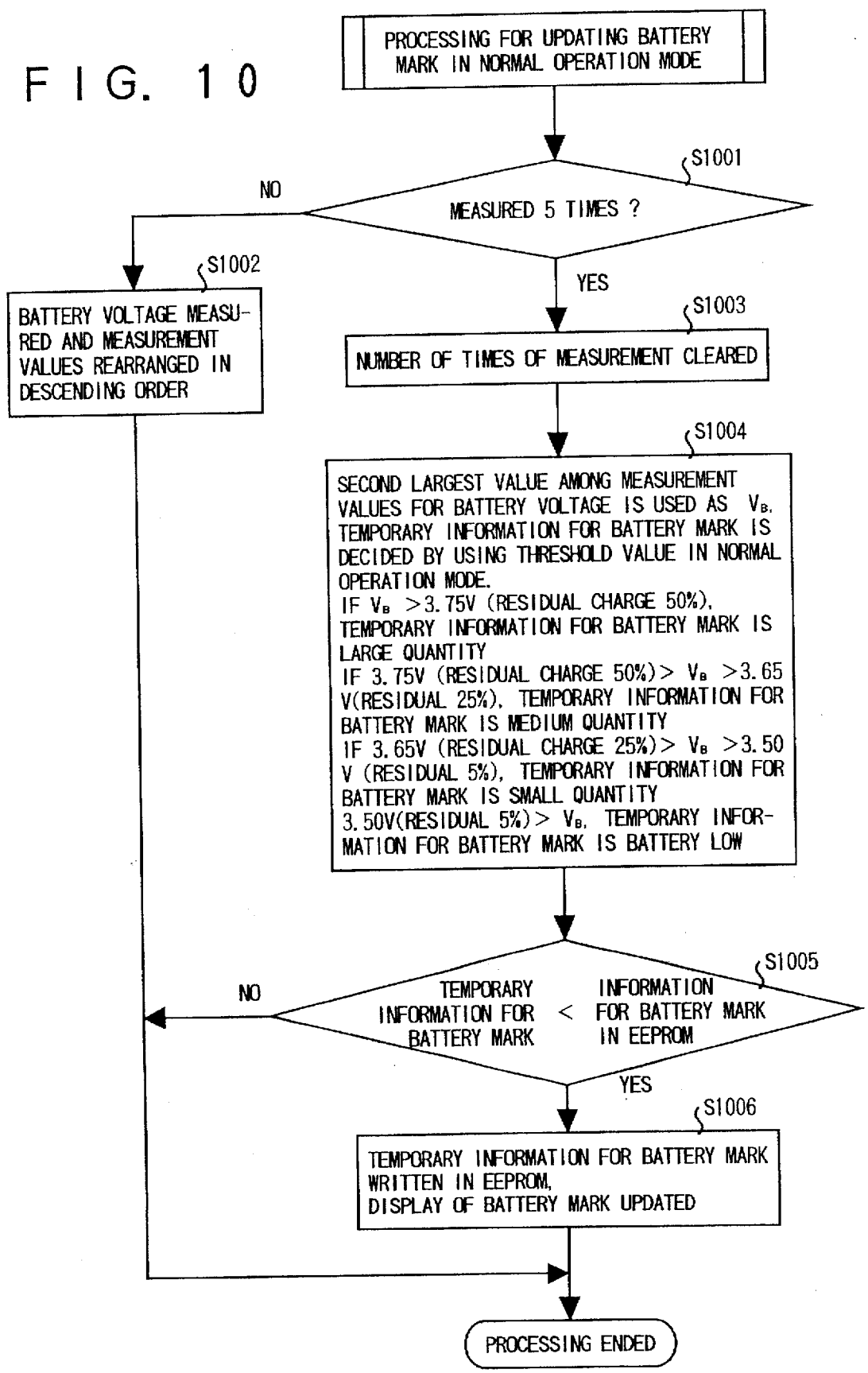
FIG. 10 is a flow chart for explaining processing of updated battery mark information in the normal operation mode.

(i) Update of a Battery Mark in the Normal Operation Mode (Refer to FIG. 10)

Next, a description is made for processing of updating of the battery mark in the normal operation mode. In the normal operation mode, a battery mark currently displayed on the display unit 111, namely the information for the battery marks stored in the storage section 110 is compared to information for a temporary battery mark determined by using the threshold value in the normal operation mode according to a representative value $V_B$ just measured, and if the temporary information for the battery mark determined from the result of current measurement thereof indicates a residual charge in the battery with a smaller quantity than that indicated by the stored information, the display of battery mark and the information for battery marks stored in the storage section 110 are updated. The processing described above is executed because a display of a residual charge in the battery is prevented from becoming unstable due to fluctuation of a battery voltage generated by change in a consumed current associated with the passage of time in such a case as intermittent receiving or intermittent burst transmission, which operations are specific to a PHS terminal.

FIG. 10 is a flow chart for explaining operations for updating the battery marks in the normal operation mode. At first, in Steps S1001 to S1003, a battery voltage at the current point of time is measured five times, and the measurement values are rearranged in a descending order.

Then in Step S1004, the second largest value among the five measurement values for the battery voltage is used as a representative value $V_B$, and temporary information for the battery mark is decided from the representative value $V_B$ by using a threshold value in the normal operation mode. Namely, the information for the battery mark is decided as "a large quantity" if the representative value $V_B$ excesses 3.75 V, as "a medium quantity" if the value is in a range from 3.65 V to 3.75 V, as "a small quantity" if in a range from 3.50 V to 3.65 V, and as "the battery is low" if it is 3.50 V or less.

Then in Step S1005, the determined temporary information for the battery mark is compared to the information for the battery marks stored in the storage section 110, and if the temporary information for the battery mark determined from the result of current measurement thereof indicates that a residual charge in the battery is smaller than that in the stored information, the display of the battery mark is updated in Step S1006, and the information for battery marks in the storage section 110 is rewritten.

Figure 11:
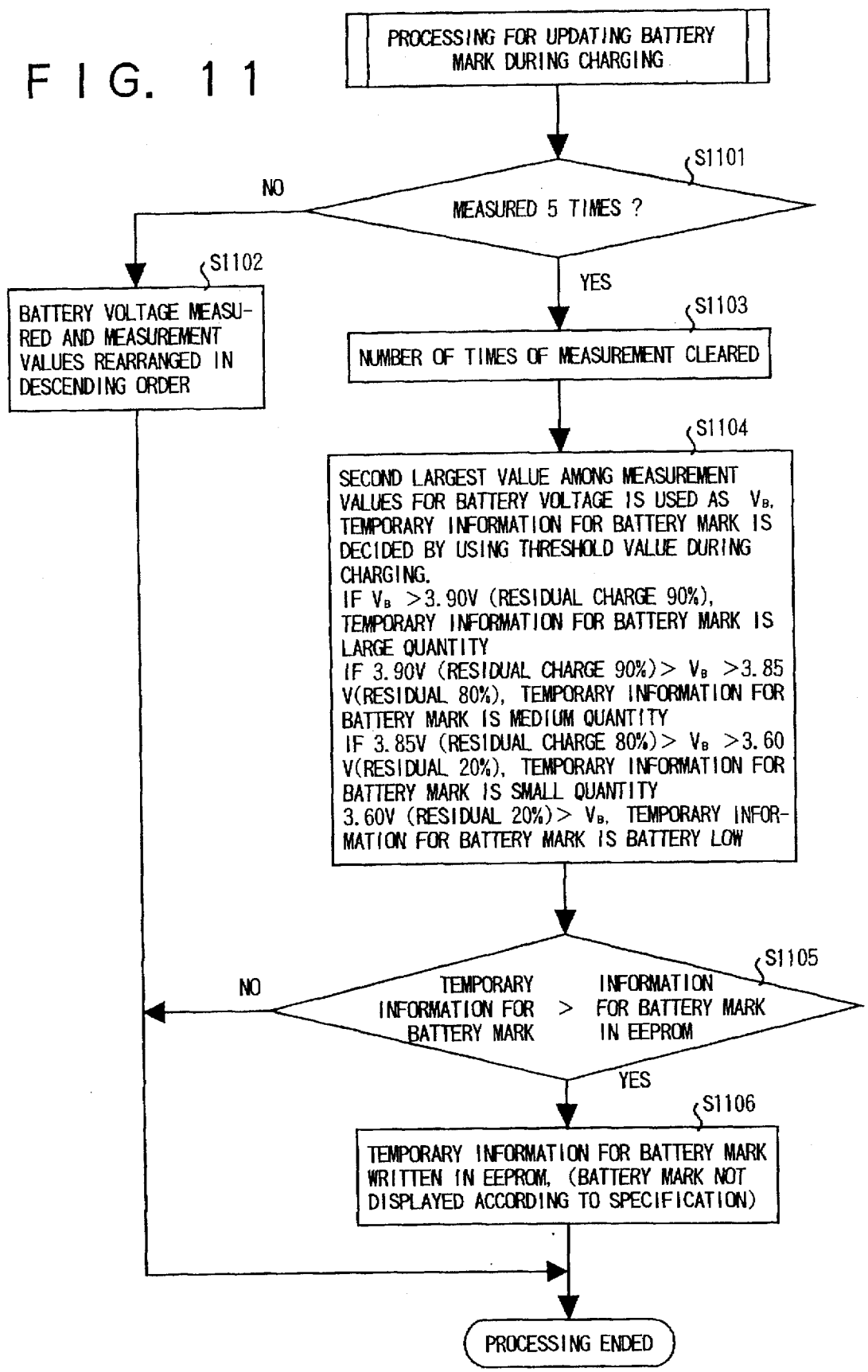
FIG. 11 is a flow chart for explaining processing of updated battery mark information during charging.

(ii) Update of a Battery Mark During Charging (Refer to FIG. 11)

Next, a description is made for updating the battery mark during charging. During charging, the information for battery mark is updated to prepare for a time when a battery mark is displayed the next time (when the event E208 of charging-OFF occurs while power is ON). As described above, a relation between a residual charge in a battery and a battery voltage in the normal operation mode is different from that during charging because of the characteristics of a battery, so that temporary information for the battery mark is decided by using a threshold value which is different from that in the normal operation mode. Namely, because of the battery characteristics, a battery voltage immediately after charging is OFF is higher than the voltage in the normal operation mode even in a case where a residual charge in the battery in the normal operation mode is the same as that during charging, so that it is possible by using a higher threshold value, to prevent such a case where the battery mark indicating the fully-charged state is displayed even though the battery has not actually been fully charged.

In updating a battery mark during charging, in contrast to that in the normal operation mode, only a change is allowed where information for the battery mark increases. This operation is made so that the information for the battery mark decided in updating the battery mark during charging will not be contradicted with that in the normal operating mode when the charging-OFF event E208 occurs and system control shifts to the state ST3 where the PHS terminal is used in the normal operation mode.

FIG. 11 is a flow chart for explaining operations of updating a battery mark during charging. At first, in Steps S1101 to S1103, a battery voltage at the current point of time is measured five times, and the measurement values are rearranged in a descending order.

Then in Step S1104, the second largest value in the five measurement values of the battery voltage is set to a representative value $V_B$, and temporary information for the battery mark is decided from the representative value $V_B$ by using the threshold value during charging. Namely, the information for the battery mark is decided as "a large quantity" if the representative value $V_B$ excesses 3.90 V, as "a medium quantity" if the value is in a range from 3.85 V to 3.90 V, as "a small quantity" if in a range from 3.60 V to 3.85 V, and as "the battery is low" if it is 3.60 V or less.

Then in Step S1105, the determined temporary information for the battery mark is compared to the information for the battery marks stored in the storage section 110, and if the temporary information for the battery mark determined from the result of current measurement thereof indicates that a residual charge in the battery is larger than that in the stored information, information for the battery mark is updated and the information for the battery marks in the storage section 110 is updated in Step S1006. It should be noted that the battery mark is not displayed herein according to the specification.

Figure 12:
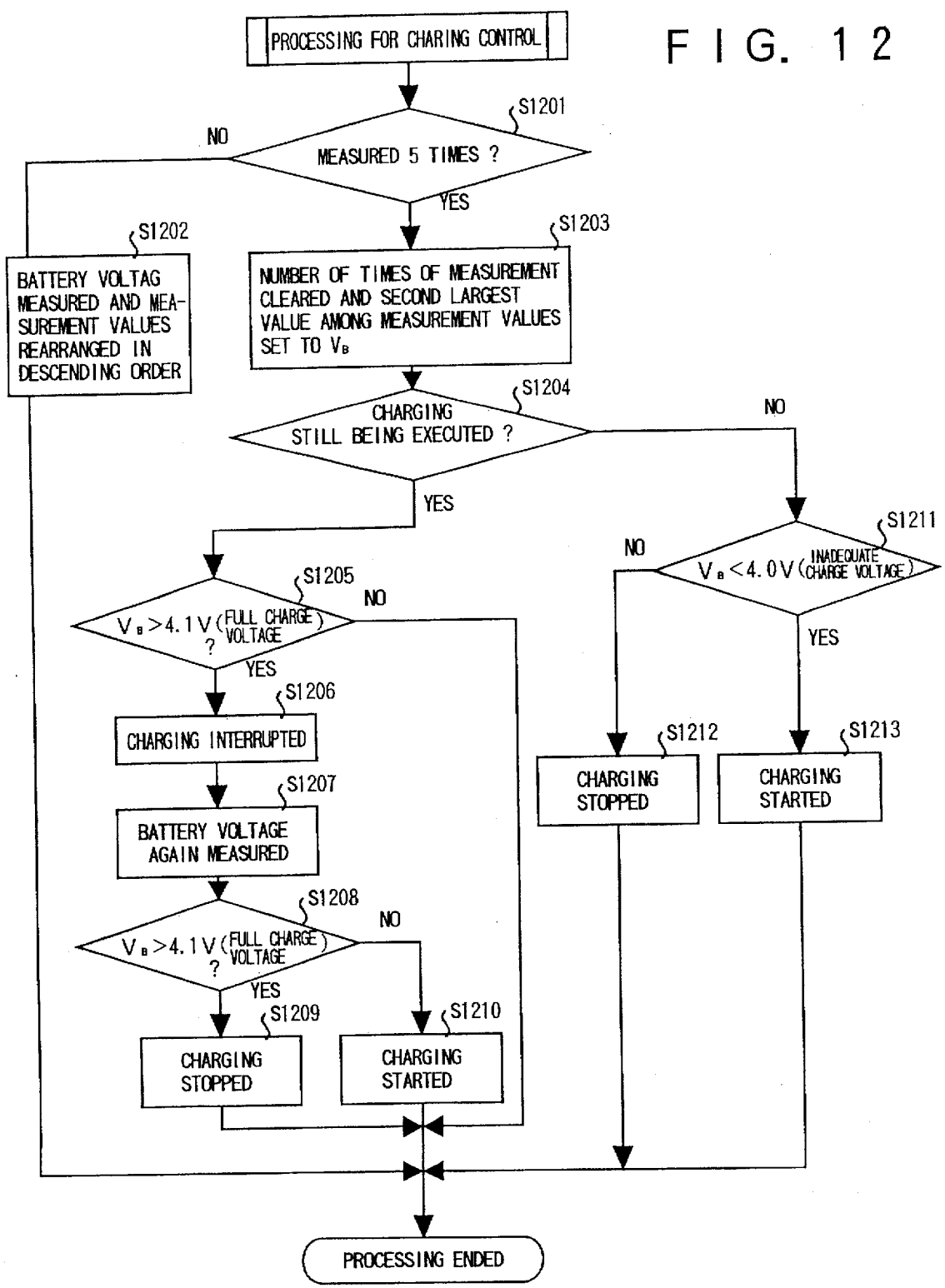
FIG. 12 is a flow chart for explaining processing of charging control information.

(iii) Charging Control (Refer to FIG. 12)

Next, a description is made for charging control. When the PHS terminal is placed on the charging base, charging control is executed. In this processing, a battery voltage is measured, and if the voltage indicates fully charged, charging is stopped, and then charging is restarted when the battery voltage has dropped to a level where battery voltage is inadequate for charging.

FIG. 12 is a flow chart for explaining operations for charging control. At first, in Steps S1201 to S1203, a battery voltage at a current point of time is measured five times, the measurement values are rearranged in a descending order, and the second largest value in the five measurement values for the battery voltage is used as a representative value $V_B$.

In Step S1204, determination is made as to whether charging is still executed or not. In a case where charging is continued, system control goes to Step S1205, and determination is made as to whether the representative value $V_B$ excesses a full charge voltage (4.1 V) or not. If the representative value does not excess the full charge voltage, the charging control is finished, and charging is continued, but if the representative value excesses the full charge voltage, system control goes to Step S1206 to interrupt charging, the battery voltage is again measured in Step S1207, and the measured voltage is again compared to the full charge voltage (4.1 V) in Step S1208. In the determination in Step S1208, if the remeasurement value $V_B$ excesses the full charge voltage, charging is stopped in Step S1209, and if the value described above does not excess the full charge voltage, charging is started in Step S1210.

Herein, after the full charge voltage is once detected, the battery voltage is again measured, and the measured voltage is again compared to the full charge voltage, the processing described above is executed because it is possible to prevent such a case where determination that the battery is fully charged is made when it is not, the incorrect determination being caused by the fact that the internal impedance becomes larger in a case where a residual charge in the battery is small.

On the other hand, in a case where it is determined in Step S1204 that charging is not being executed, system control goes to Step S1211, and determination is made as to whether the representative value $V_B$ is less than a level where the battery voltage is inadequate for charging (4. 0 V) or not. If the representative value is more than the level, charging is stopped in Step S1212, and if the value is less than the level, charging is started in Step S1206.

This application is based on Japanese patent application No. HEI 8-036881 filed in the Japanese Patent Office on Feb. 23, 1996, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A charging device for charging a battery in a battery-supplied portable electronic apparatus and displaying a residual charge in said battery comprising:

a battery voltage measuring section for measuring a voltage of said battery;

a storage section for storing a measurement value obtained by said battery voltage measuring section; and a control section for periodically measuring a battery voltage with said battery voltage measuring section when the portable electronic apparatus is used in a normal operation mode, updating a measurement value stored in said storage section only when a measurement value at a current point of time is smaller than a pervious measurement value stored in said storage section and displaying a residual charge in said battery according to said measurement value updated in the storage section, allowing measurement during intermittent battery charge receiving or intermittent battery charge burst transmissions, when a consumed charge is sufficiently large such that the battery voltage changes substantially with time.

2. A charging device according to claim 1 comprising a charging control section for controlling supply of charging voltage to said battery, wherein said control section measures a battery voltage with said battery voltage measuring section and makes determination as to whether the battery has been fully charged or not to detect a state where a charging voltage is not required to be supplied from said charging control section.

3. A charging device for charging a battery in a battery-supplied portable electronic apparatus and displaying a residual charge in said battery comprising:

a battery voltage measuring section for measuring a voltage said battery;

a storage section for storing a measurement value obtained by said battery voltage measuring section; and a control section for periodically measuring a battery voltage with said battery voltage measuring section when the portable electronic apparatus is used in a normal operation mode, updating a measurement value stored in said storage section only when a measurement value at a current point of time is smaller than a previous measurement value stored in said storage section and displaying a residual charge in said battery according to said measurement value updated in the storage section;

wherein information indicating that a battery was removed and again set therein is stored in said storage section after said battery was once removed and again set therein, and said control section measures a battery voltage with said battery voltage measuring section, updates a measurement value stored in said storage section, and displays a residual charge in said battery according to said updated measurement value in the storage section, or determines a rank according to said updated measurement value in the storage section and identifies/displays a residual charge in said battery according to said rank, immediately after power is turned ON or after supply of a charging voltage to said battery is stopped in a case the information indicating that a battery was once removed and then set again is stored in said storage section, in a case where a measurement value stored in said storage section is not more than a prespecified value, or in a case where a rank decided according to a measurement value stored in said storage section is not more than a prespecified rank.

4. A charging device for charging a battery in a battery-supplied portable electronic apparatus and displaying a residual charge in said battery comprising:

a battery voltage measuring section for measuring a voltage in said battery;

a storage section for storing therein a measurement value obtained by said battery voltage measuring section; and a control section for periodically measuring a battery voltage with said battery voltage measuring section during charging, updating a measurement value stored in said storage section only when a measurement value at a current point of time is larger than a previous measurement value stored in said storage section, and displaying a residual charge in said battery according to said updated measurement value in the storage section.

5. A charging device according to claim 4 comprising a charging control section for controlling supply of charging voltage to said battery; wherein said control section measures a battery voltage with said battery voltage measuring section and makes determination as to whether the battery has been fully charged or not to detect a state where a charging voltage is not required to be supplied from said charging control section.

6. A charging device for charging a battery in a battery-supplied portable electronic apparatus and displaying a residual charge in said battery comprising:

a battery voltage measuring section for measuring a voltage of said battery;

a storage section for storing therein a measurement value obtained by said battery voltage measuring section; and a control section for periodically measuring a battery voltage with said battery voltage measuring section during charging, updating a measurement value stored in said storage section only when a measurement value at a current point of time is larger than a previous measurement value stored in said storage section, and displaying a residual charge in said battery according to said updated measurement value in the storage section;

wherein information indicating that a battery was removed and again set therein is stored in said storage section after said battery was once removed and again set therein, and said control section measures a battery voltage with said battery voltage measuring section, updates a measurement value stored in said storage section, and displays a residual charge in said battery according to said updated measurement value in the storage section, or decides a rank according to said updated measurement value in the storage section and identifies/displays a residual charge in said battery according to said rank, immediately after power is turned ON or after supply of a charging voltage to said battery is stopped in a case the information indicating that a battery was once removed and then set again is stored in said storage section, in a case where a measurement value stored in said storage section is not more than a prespecified value, or in a case where a rank decided according to a measurement value stored in said storage section is not more than a prespecified rank.

7. A charging device for charging a battery in a battery-supplied portable electronic apparatus and identifying/displaying a residual charge in said battery with a specified rank comprising:

a battery voltage measuring section for measuring a voltage in said battery;

a storage section for storing therein a measurement value obtained by said battery voltage measuring section; and a control section for periodically measuring a battery voltage with said battery voltage measuring section when the portable electronic apparatus is used in a normal operation mode, updating a measurement value in said storage section only when a measurement value at a current point of time is smaller than a previous measurement value stored in said storage section, and also for periodically measuring a battery voltage with said battery voltage measuring section, updating a measurement value in said storage section only when a measurement value at the current point of time is larger than a previous measurement value stored in said storage section, deciding a rank according to said updated measurement value in the storage section, and identifying/displaying a residual charge in said battery according to said rank; wherein a threshold value for defining a rank in the normal operation mode is different from that during charging.

8. A charging device according to claim 7 comprising a charging control section for controlling supply of charging voltage to said battery, wherein said control section measures a battery voltage with said battery voltage measuring section and makes determination as to whether the battery has fully been charged or not to detect a state where a charging voltage is not required to be supplied from said charging control section.

9. A charging device according to claim 7; wherein information indicating that a battery was removed and again set therein is stored in said storage section after said battery was once removed and again set therein, and said control section measures a battery voltage with said battery voltage measuring section, updates a measurement value stored in said storage section, and displays a residual charge in said battery according to said updated measurement value in the storage section, or decides a rank according to said updated measurement value in the storage section and identifies/displays a residual charge in said battery according to said rank, immediately after power is turned ON or after supply of a charging voltage to said battery is stopped in a case the information indicating that a battery was once removed and then set again is stored in said storage section, in a case where a measurement value stored in said storage section is not more than a prespecified value, or in a case where a rank decided according to a measurement value stored in said storage section is not more than a prespecified rank.

10. A system for charging a battery comprising:

a charging circuit connectable to the battery for supplying power for charging the battery;

a measuring circuit responsive to the battery for measuring voltage on said battery;

a display unit responsive to said measuring circuit for displaying a value of a residual charge in said battery; and a processing unit responsive to said measuring circuit for periodically updating the value displayed by said display unit when intermittent battery charge receiving or intermittent battery charge burst transmission occurs and a consumed charge of the battery is sufficiently large such that the battery voltage changes substantially with time.

11. The system of claim 10, wherein said processing unit controls a switch for connecting said charging circuit to said battery.

12. The system of claim 11, wherein said processing unit compares a current measurement result with a stored measurement result corresponding to the displayed value to update the displayed value only if the current measurement result indicates that a residual charge in the battery is reduced.

13. A charging device for charging a battery in a battery-supplied portable electronic apparatus and displaying a residual charge in said battery comprising:

a battery voltage measuring section for measuring a voltage of said battery;

a storage section for storing a measurement value obtained by said battery voltage measuring section; and a control section for periodically measuring a battery voltage with said battery voltage measuring section when the portable electronic apparatus is used in a normal operation mode, wherein a measurement value stored in said storage section remains the same when a value at a current point of time is larger than a previous measurement value stored in said storage section and displaying a residual charge in said battery according to said measurement value that remains the same in the storage section.

* * * * *